United States Patent
Shao

(10) Patent No.: US 10,290,329 B2
(45) Date of Patent: May 14, 2019

(54) CHARGE PUMP APPARATUS

(71) Applicant: eMemory Technology Inc., Hsinchu (TW)

(72) Inventor: Chi-Yi Shao, Taichung (TW)

(73) Assignee: eMemory Technology Inc., Hsinchu (TW)

( * ) Notice: Subject to any disclaimer, the term of this patent is extended or adjusted under 35 U.S.C. 154(b) by 57 days.

(21) Appl. No.: 15/352,610

(22) Filed: Nov. 16, 2016

(65) Prior Publication Data
US 2018/0019005 A1    Jan. 18, 2018

Related U.S. Application Data

(60) Provisional application No. 62/362,068, filed on Jul. 14, 2016.

(51) Int. Cl.
| | |
|---|---|
| *H03H 11/26* | (2006.01) |
| *G11C 5/14* | (2006.01) |
| *H03K 3/03* | (2006.01) |
| *H03K 17/28* | (2006.01) |
| *H03K 19/20* | (2006.01) |
| *G11C 16/12* | (2006.01) |
| *H02M 3/07* | (2006.01) |
| *G11C 16/04* | (2006.01) |
| *H02M 1/00* | (2006.01) |

(52) U.S. Cl.
CPC ............ *G11C 5/145* (2013.01); *G11C 16/12* (2013.01); *H02M 3/073* (2013.01); *H03K 3/0315* (2013.01); *H03K 17/28* (2013.01); *H03K 19/20* (2013.01); *G11C 16/0433* (2013.01); *H02M 2001/007* (2013.01)

(58) Field of Classification Search
CPC ...... G11C 5/145; H03K 3/0315; H03K 17/28; H03K 19/20
USPC .......................................................... 327/284
See application file for complete search history.

(56) References Cited

U.S. PATENT DOCUMENTS

| | | |
|---|---|---|
| 5,625,544 A | 4/1997 | Kowshik et al. |
| 5,644,534 A | 7/1997 | Soejima |
| 5,889,664 A * | 3/1999 | Oh .................. G11C 5/143 327/536 |
| 6,914,791 B1 * | 7/2005 | Park .................. H02M 3/073 327/536 |
| 6,980,045 B1 * | 12/2005 | Liu .................. H02M 3/073 327/536 |

(Continued)

FOREIGN PATENT DOCUMENTS

| | | |
|---|---|---|
| JP | H09297997 | 11/1997 |
| JP | H11283392 | 10/1999 |

(Continued)

OTHER PUBLICATIONS

"Search Report of Europe Counterpart Application", dated Aug. 30, 2017, p. 1-p. 8.

(Continued)

*Primary Examiner* — Metasebia T Retebo
(74) *Attorney, Agent, or Firm* — JCIPRNET

(57) ABSTRACT

A charge pump apparatus is provided. A two-phase clock signal and a four-phase clock signal for respectively driving a two-phase charge pump circuit and a four-phase charge pump circuit are generated according to delay signals of coupling nodes between delay circuits of a ring oscillator circuit.

13 Claims, 9 Drawing Sheets

(56) References Cited

U.S. PATENT DOCUMENTS

| | | |
|---|---|---|
| 7,046,076 B2 | 5/2006 | Daga et al. |
| 7,123,077 B2 | 10/2006 | Chiu et al. |
| 7,317,347 B2 | 1/2008 | Mensi et al. |
| 7,683,699 B2 | 3/2010 | Fort et al. |
| 8,896,367 B1 | 11/2014 | Lin |
| 2011/0063039 A1* | 3/2011 | Maruko ................ G06F 1/12 |
| | | 331/1 R |

FOREIGN PATENT DOCUMENTS

| | | |
|---|---|---|
| JP | 2008198985 | 8/2008 |
| JP | 2008253031 | 10/2008 |
| JP | 2008301647 | 12/2008 |

OTHER PUBLICATIONS

"Office Action of Japan Counterpart Application," dated Sep. 5, 2017, p. 1-p. 9.

* cited by examiner

CHARGE PUMP APPARATUS

CROSS-REFERENCE TO RELATED APPLICATION

This application claims the priority benefits of U.S. provisional application Ser. No. 62/362,068, filed on Jul. 14, 2016. The entirety of the above-mentioned patent application is hereby incorporated by reference herein and made a part of this specification.

BACKGROUND

Technical Field

The present invention relates to a charge pump apparatus, and more particularly to a charge pump apparatus including a two-phase charge pump circuit and a four-phase charge pump circuit.

Description of Related Art

It has been prone to reduce the operating voltage of the semiconductor memory apparatus to reduce the electrical power consumption in these years. However, part of circuit of the semiconductor memory such as word line diver or output driver still need to be operated under a relatively high voltage. Accordingly, the charge pump circuit plays an important role in the semiconductor memory apparatus.

Generally speaking, the types of the charge pump circuit include two-phase charge pump circuit, four-phase charge pump circuit, and so forth. The two-phase charge pump circuit has higher efficiency, occupies smaller area and has lower power consumption; however, a problem of body effect exists in the circuit if deep Nwell not provided in process flow. On the other hand, although the problem of body effect does not exist in the four-phase charge pump circuit, the efficiency thereof is lower. And, additional delay circuits are needed to generate four clock signals for driving the four-phase charge pump circuit, therefore the area of the circuit layout is substantially increased.

SUMMARY

The present invention is directed to a charge pump apparatus with the characteristics of high efficiency, small area and low power consumption, being without the problem of body effect, and the voltage needed can be generated accurately.

The charge pump apparatus of the present invention includes a first two-phase charge pump circuit, a first four-phase charge pump circuit and a driving circuit. The first four-phase charge pump circuit is coupled to an output terminal of the first two-phase charge pump circuit to serial connect to the first two-phase charge pump circuit. The driving circuit is coupled to the first two-phase charge pump circuit and the first four-phase charge pump circuit. The driving circuit includes a ring oscillator circuit and a logic circuit. The ring oscillator circuit includes a plurality of delay circuits connected in series as a delay circuit chain, the output terminal of the delay circuit chain is coupled to the input terminal of the delay circuit chain, the input terminal of the delay circuit chain receives an input clock signal. The logic circuit is coupled to the ring oscillator circuit, the first two-phase charge pump circuit and the first four-phase charge pump circuit, the logic circuit generates a first two-phase clock signal for driving the first two-phase charge pump circuit and a first four-phase clock signal for driving the first four-phase charge pump circuit according to a plurality of delay signals of coupling a plurality of nodes between the delay circuits.

In one embodiment of the present invention, the delay circuit chain includes a first delay circuit, a second delay circuit and a third delay circuit connected in series, the first delay circuit delays the input clock signal, the second delay circuit delays an output signal of the first delay circuit, the third delay circuit delays an output signal of the second delay circuit, and the logic circuit generates the first two-phase clock signal according to the output signal of the first delay circuit, where the first two-phase clock signal includes a first clock signal and a second clock signal being inverse to each other.

In one embodiment of the present invention, the logic circuit further generates a first four-phase clock signal including a third clock signal, a fourth clock signal, a fifth clock signal and a sixth clock signal according to the output signals of the second delay circuit and the third delay circuit.

In one embodiment of the present invention, the logic circuit includes a first inverter, a second inverter, a third inverter, a fourth inverter, a fifth inverter, a first OR gate and a first NAND gate. The input terminal of the first inverter is coupled to the output terminal of the first delay circuit, and the first inverter outputs the first clock signal. The input terminal of the second inverter is coupled to the output terminal of the first inverter, and the second inverter outputs the second clock signal. The input terminal of the third inverter is coupled to the output terminal of the second delay circuit, and the third inverter outputs the third clock signal. The input terminal of the fourth inverter is coupled to the output terminal of the third inverter, and the fourth inverter outputs the fourth clock signal. The input terminal of the fifth inverter is coupled to the output terminal of the third delay circuit. Two input terminals of the first OR gate respectively coupled to the output terminal of the fifth inverter and the output terminal of the second delay circuit, and the first OR gate outputs the third clock signal. Two input terminals of the first NAND gate respectively coupled to the output terminal of the fifth inverter and the output terminal of the second delay circuit, and the first NAND gate outputs the fourth clock signal.

In one embodiment of the present invention, the charge pump apparatus further includes a second four-phase charge pump circuit coupled to the output terminal of the first four-phase charge pump circuit to serial connect to the first two-phase charge pump circuit and the first four-phase charge pump circuit, the logic circuit further generates a second four-phase clock signal for driving the second four-phase charge pump circuit according to the delay signals of coupling the nodes between the delay circuits.

In one embodiment of the present invention, the delay circuit chain further includes a fourth delay circuit and a fifth delay circuit serial connected to the third delay circuit, the fourth delay circuit delays the output signal of the third delay circuit, the fifth delay circuit delays the output signal of the fourth delay circuit, the logic circuit further generates a second four-phase clock signal including a seventh clock signal, an eighth clock signal, a ninth clock signal and a tenth clock signal according to the output signals of the fourth delay circuit and the fifth delay circuit.

In one embodiment of the present invention, the logic circuit further includes a sixth inverter, a seventh inverter, an eighth inverter, a second OR gate and a second NAND gate. The input terminal of the sixth inverter is coupled to the output terminal of the fourth delay circuit, and the sixth inverter outputs the seventh clock signal. The input terminal of the seventh inverter is coupled to the output terminal of the sixth inverter, and the seventh inverter outputs the eighth clock signal. The input terminal of the eighth inverter is coupled to the output terminal of the fifth delay circuit. Two input terminals of the second OR gate respectively coupled to the output terminal of the eighth inverter and the output terminal of the fifth delay circuit, and the second OR gate outputs the ninth clock signal. Two input terminals of the second NAND gate respectively coupled to the output terminal of the eighth inverter and the output terminal of the fifth delay circuit, and the second NAND gate outputs the tenth clock signal.

In one embodiment of the present invention, the charge pump apparatus further includes a second two-phase charge pump circuit coupled between the output terminal of the first two-phase charge pump circuit and the first four-phase charge pump circuit, the logic circuit further generates a second two-phase clock signal for driving the second two-phase charge pump circuit according to the delay signals of coupling the nodes between the delay circuits.

In one embodiment of the present invention, the logic circuit further generates the second two-phase clock signal according to the output signal of the second delay circuit, and the second two-phase clock signal includes a third clock signal and a fourth clock signal being inverse to each other.

In one embodiment of the present invention, the delay circuit chain further includes a fourth delay circuit and a fifth delay circuit serial connected to the third delay circuit, the fourth delay circuit delays the output signal of the third delay circuit, the fifth delay circuit delays the output signal of the fourth delay circuit, the logic circuit further generates a first four-phase clock signal including a fifth clock signal, a sixth clock signal, a seventh clock signal and an eighth clock signal according to the output signals of the fourth delay circuit and the fifth delay circuit.

In one embodiment of the present invention, the logic circuit includes a first inverter, a second inverter, a third inverter, a fourth inverter, a fifth inverter, a sixth inverter, a seventh inverter, an OR gate and a NAND gate. The input terminal of the first inverter is coupled to the output tell final of the first delay circuit, and the first inverter outputs the first clock signal. The input terminal of the second inverter is coupled to the output terminal of the first inverter, and the second inverter outputs the second clock signal. The input terminal of the third inverter is coupled to the output terminal of the second delay circuit, and the third inverter outputs the third clock signal. The input terminal of the fourth inverter is coupled to the output terminal of the third inverter, and the fourth inverter outputs the fourth clock signal. The input terminal of the fifth inverter is coupled to the output terminal of the fourth delay circuit, and the fifth inverter outputs the fifth clock signal. The input terminal of the sixth inverter is coupled to the output terminal of the fifth inverter, and the sixth inverter outputs the sixth clock signal. The input terminal of the seventh inverter is coupled to the output terminal of the fifth delay circuit. Two input terminals of the OR gate respectively coupled to the output terminal of the seventh inverter and the output terminal of the fourth delay circuit, and the OR gate outputs the seventh clock signal. Two input terminals of the NAND gate respectively coupled to the output terminal of the seventh inverter and the output terminal of the fourth delay circuit, and the NAND gate outputs the eighth clock signal.

In one embodiment of the present invention, the ring oscillator circuit further includes a NAND gate, one input terminal of the NAND gate receives an input clock signal, another input terminal of the NAND gate is coupled to the output terminal of the delay circuit chain, the output terminal of the NAND gate is coupled to the input terminal of the delay circuit chain.

In one embodiment of the present invention, the ring oscillator circuit further includes a latch circuit coupled between the output terminal of the delay circuit chain and the another input terminal of the NAND gate, and determines whether to output the signal from the output terminal of the delay circuit chain to the NAND gate according to a control signal.

The present invention further provides a charge pump apparatus including a two-phase charge pump circuit, a plurality of four-phase charge pump circuits and a driving circuit. The four-phase charge pump circuits are coupled to the output terminal of the two-phase charge pump circuit to serial connect to the two-phase charge pump circuit. The driving circuit is coupled to the two-phase charge pump circuit and the four-phase charge pump circuits. The driving circuit includes a ring oscillator circuit and a logic circuit. The ring oscillator circuit includes a plurality of delay circuits connected in series as a delay circuit chain, the output terminal of the delay circuit chain is coupled to the input terminal of the delay circuit chain, the input terminal of the delay circuit chain receives an input clock signal. The logic circuit is coupled to the ring oscillator circuit, the two-phase charge pump circuit and the four-phase charge pump circuits, and generates a two-phase clock signal for driving the two-phase charge pump circuit and a plurality of first four-phase clock signals and a plurality of second four-phase clock signals for driving the four-phase charge pump circuits according to a plurality of delay signals of coupling a plurality of nodes between the delay circuits, where the first four-phase clock signals are configured to drive corresponding odd-numbered four-phase charge pump circuits, and the second four-phase clock signals are configured to drive corresponding even-numbered four-phase charge pump circuits.

In one embodiment of the present invention, the delay circuit chain includes a first delay circuit, a second delay circuit, a third delay circuit and a fourth delay circuit connected in series, the first delay circuit delays the input clock signal, the second delay circuit delays an output signal of the first delay circuit, the third delay circuit delays an output signal of the second delay circuit, and the fourth delay circuit delays the output signal of the third delay circuit, the logic circuit further generates the two-phase clock signal according to the output signal of the first delay circuit, generates the first four-phase clock signal according to the output signals of the second delay circuit and the third delay circuit, and generates the second four-phase clock signal according to the output signals of the third delay circuit and the fourth delay circuit.

In one embodiment of the present invention, the two-phase clock signal includes a first clock signal and a second clock signal being inverse to each other, the first four-phase clock signal includes the first clock signal, the second clock signal, a third clock signal and a fourth clock signal, and the second four-phase clock signal includes a fifth clock signal, a sixth clock signal, a seventh clock signal and an eighth clock signal, where the fifth clock signal and the sixth clock signal are inverse to each other.

In one embodiment of the present invention, the logic circuit includes a first inverter, a second inverter, a third inverter, a fourth inverter, a fifth inverter, a sixth inverter, a first OR gate, a second OR gate, a first NAND gate and a second NAND gate. The input terminal of the first inverter is coupled to the output terminal of the first delay circuit, and the first inverter outputs the first clock signal. The second inverter is coupled to the output terminal of the first inverter, and outputs the second clock signal. The input terminal of the third inverter is coupled to the output terminal of the second delay circuit. Two input terminals of the first OR gate respectively coupled to the output terminal of the third inverter and the output terminal of the first delay circuit, and the first OR gate outputs the third clock signal. Two input terminals of the first NAND gate respectively coupled to the output terminal of the third inverter and the output terminal of the first delay circuit, and the first NAND gate outputs the fourth clock signal. The input terminal of the fourth inverter is coupled to the output terminal of the third delay circuit, and the fourth inverter outputs the fifth clock signal. The input terminal of the fifth inverter is coupled to the output terminal of the fourth inverter, and the fifth inverter outputs the sixth clock signal. The input terminal of the sixth inverter is coupled to the output terminal of the fourth delay circuit. Two input terminals of the second OR gate respectively coupled to the output terminal of the sixth inverter and the output terminal of the fourth delay circuit, and the second OR gate outputs the seventh clock signal. Two input terminals of the second NAND gate respectively coupled to the output terminal of the sixth inverter and the output terminal of the fourth delay circuit, and the second NAND gate outputs the eighth clock signal.

In one embodiment of the present invention, the ring oscillator circuit further includes a NAND gate, one input terminal of the NAND gate receives an input clock signal, another input terminal of the NAND gate is coupled to the output terminal of the delay circuit chain, the output terminal of the NAND gate is coupled to the input terminal of the delay circuit chain.

In one embodiment of the present invention, the ring oscillator circuit further includes a latch circuit coupled between the output terminal of the delay circuit chain and the another input terminal of the NAND gate, and determines whether to output the signal from the output terminal of the delay circuit chain to the NAND gate according to a control signal.

Based on the above, the charge pump apparatus of the embodiments of the present invention generates a two-phase clock signal and a four-phase clock signal for respectively driving a two-phase charge pump circuit and a four-phase charge pump circuit according to delay signals of coupling nodes between delay circuits of a ring oscillator circuit, therefore the additional delay circuits for generating the clock signals for driving the four-phase charge pump circuits is unnecessary, and the advantages of the two-phase charge pump circuit and the four-phase charge pump circuit are combined by serial connecting the two-phase charge pump circuit and the four-phase charge pump circuit, so the charge pump apparatus has the characteristics of high efficiency, small area and low power consumption, and being without the problem of body effect, therefore the voltage needed can be generated accurately.

To make the above features and advantages of the present invention more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The term "couple" used in the present application (including the claims) can be referred as any direct or indirect ways of connection. For example, "first apparatus is coupled to second apparatus" can be explained as "first apparatus is directly coupled to second apparatus", or "first apparatus is indirectly coupled to second apparatus through other apparatus or connecting means". In addition, the elements/apparatus/steps with the same reference number are indicating the same or like parts in appropriate places of the drawings and the descriptions. The elements/apparatus/steps with the same reference numbers in different embodiments may be referred to each other.

Multiple embodiments are provided below to detail describe the disclosure, but the disclosure is not limited to the embodiments provided, and the provided embodiments may be combined in an appropriate way. In the following embodiments, the same or like numbers stand for the same or like elements or signals.

Figure 1:
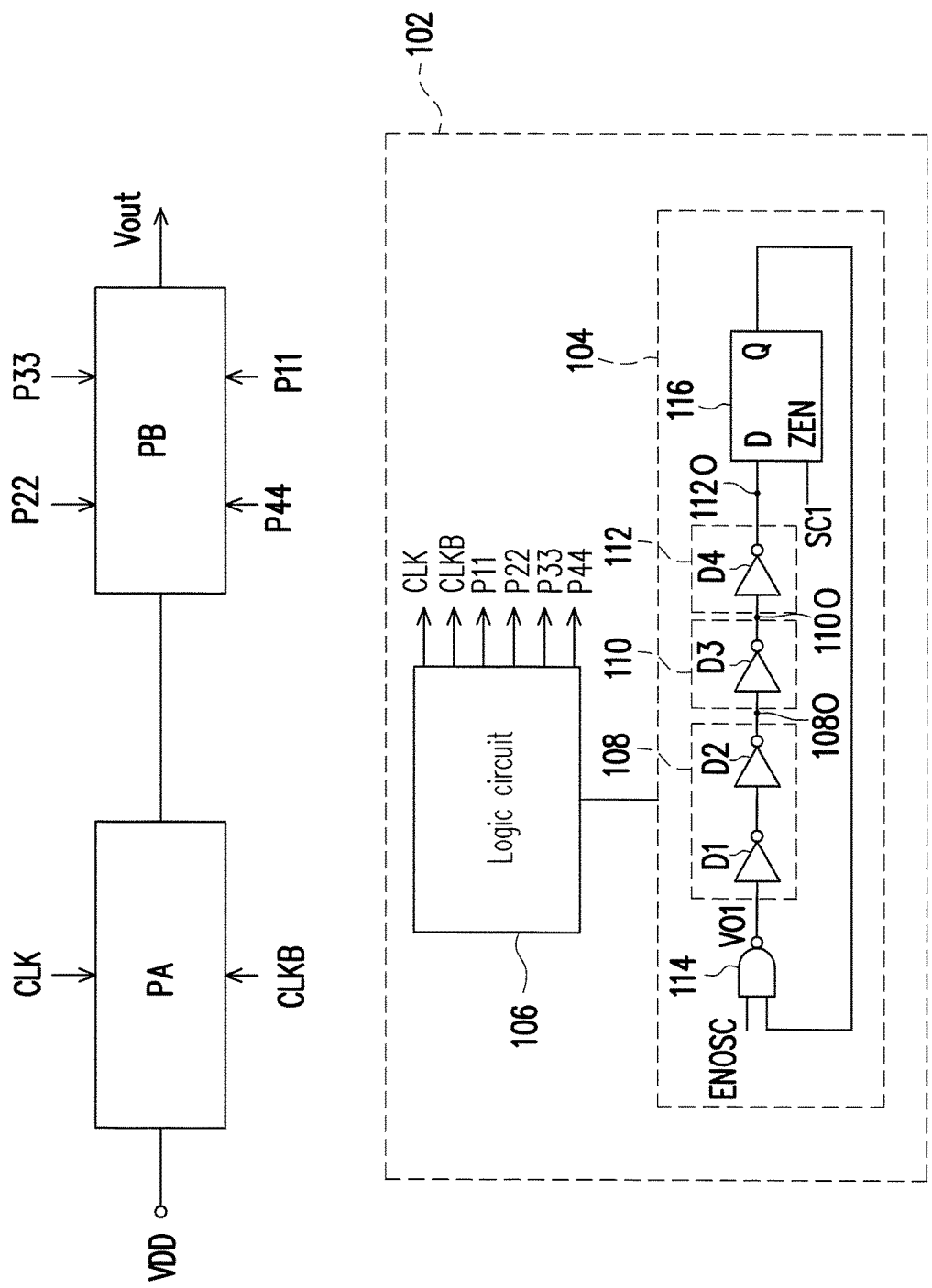
FIG. 1 is a schematic diagram of a charge pump apparatus according to an embodiment of the present invention.

FIG. 1 is a schematic diagram of a charge pump apparatus according to an embodiment of the present invention. Please refer to FIG. 1. The charge pump apparatus includes two-phase charge pump circuit PA, four-phase charge pump circuit PB and driving circuit 102, where two-phase charge pump circuit PA is coupled to input voltage VDD and four-phase charge pump circuit PB, driving circuit 102 is coupled to two-phase charge pump circuit PA and four-phase charge pump circuit PB. Two-phase charge pump circuit PA receives clock signal CLK and clock signal CLKB from driving circuit 102 and thus being driven, so as to step up input voltage VDD. Four-phase charge pump circuit PB receives clock signals P11, P22, P33 and P44 from driving circuit 102 and thus being driven, so as to step up input voltage from two-phase charge pump circuit PA, and then generate output voltage Vout.

Figure 2:
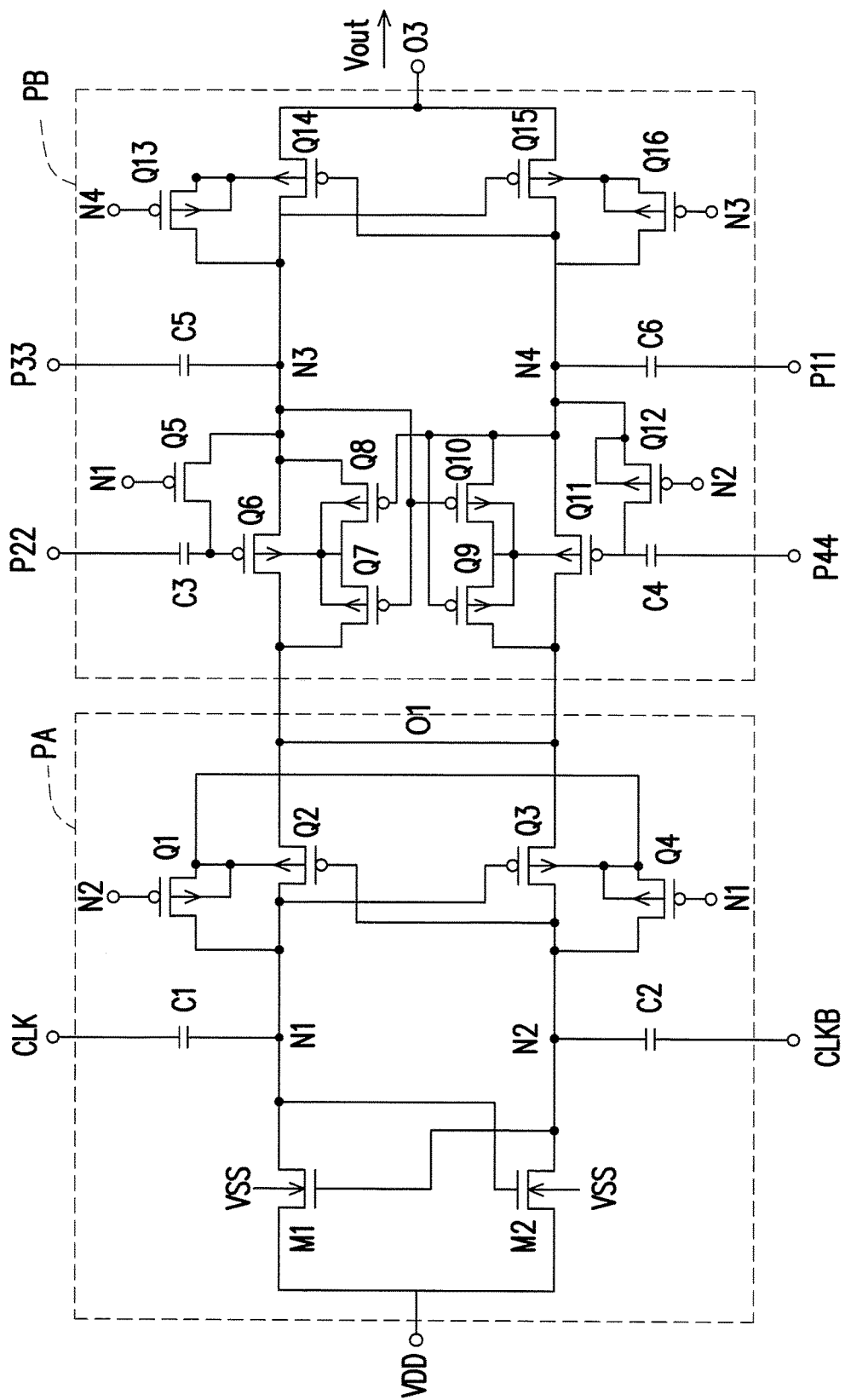
FIG. 2 is a schematic diagram of a two-phase charge pump circuit and a four-phase charge pump circuit according to an embodiment of the present invention.

Furthermore, two-phase charge pump circuit PA and four-phase charge pump circuit PB may be implemented as shown in FIG. 2. Please refer to FIG. 2. Two-phase charge pump circuit PA may include N-type transistors M1 and M2, P-type transistors Q1 to Q4, and capacitors C1 and C2. In which, N-type transistor M1 is coupled between input voltage VDD and the first terminal (node N1) of capacitor C1, the gate of N-type transistor M1 is coupled to the first terminal (node N2) of capacitor C2, N-type transistor M2 is coupled between input voltage VDD and the first terminal of capacitor C2, the gate of N-type transistor M2 is coupled to the first terminal of capacitor C1, the second terminals of capacitor C1 and capacitor C2 receives clock signal CLK and clock signal CLKB respectively. In addition, the bodies of N-type transistors M1 and M2 are coupled to ground voltage VSS. It should be noted that the bodies of N-type transistors M1 and M2 may also be coupled to the input terminal of two-phase charge pump circuit PA in some embodiments to solve the body effect. Moreover, the drain and the gate of P-type transistor Q1 are respectively coupled to node N1 and N2, the source of P-type transistor Q1 is coupled to the drain of P-type transistor Q4, the body of P-type transistor Q1 is coupled to the drain of the same and is connected to the body of P-type transistor Q2. P-type transistor Q2 is coupled between node N1 and output terminal O1 of two-phase charge pump circuit PA, and the gate of P-type transistor Q2 is coupled to node N2. P-type transistor Q3 is coupled between node N2 and output terminal O1 of two-phase charge pump circuit PA, the gate of P-type transistor Q2 is coupled to node N1, the body of P-type transistor Q3 is coupled to the drain of P-type transistor Q4. The body and the drain of P-type transistor Q4 are coupled to each other, the source and the gate of P-type transistor Q4 are respectively coupled to nodes N2 and N1.

On the other hand, four-phase charge pump circuit PB may include P-type transistors Q5 to Q16 and capacitors C3 to C6. In which, P-type transistor Q6 is coupled to output terminal O1 of two-phase charge pump circuit PA and the first terminal (node N3) of capacitor C5, the gate of P-type transistor Q6 is coupled to one terminal of capacitor C3, another terminal of capacitor C3 receives clock signal P22, the second terminal of capacitor C5 receives clock signal P33. P-type transistor Q5 is coupled between the gate of P-type transistor Q6 and node N3, the gate of P-type transistor Q5 is coupled to node N1 of two-phase charge pump circuit PA in the previous stage. P-type transistor Q7 is coupled to output terminal O1 of two-phase charge pump circuit PA and the source of P-type transistor Q8, the gate of P-type transistor Q7 is coupled to node N3, the body of P-type transistor Q7 is coupled to the drain of the same and is coupled to the body of P-type transistor Q6, the drain of P-type transistor Q8 is coupled to node N3, the body of P-type transistor Q8 is coupled to the source of the same and is coupled to the body of P-type transistor Q6, the gate of P-type transistor Q8 is coupled to node N4. P-type transistor Q13 is coupled between node N3 and the body of P-type transistor Q14, the gate of P-type transistor Q13 is coupled to node N4, the body and the drain of P-type transistor Q13 are coupled to each other. P-type transistor Q14 is coupled between node N3 and output terminal O3 of four-phase charge pump circuit PB, the gate of P-type transistor Q14 is coupled to node N4. P-type transistor Q11 is coupled to output terminal O1 of two-phase charge pump circuit PA and the first terminal (node N4) of capacitor C6, the gate of P-type transistor Q11 is coupled to one terminal of capacitor C4, another terminal of capacitor C4 receives clock signal P44, the second terminal of capacitor C6 receives clock signal P11. P-type transistor Q12 is coupled between the gate of P-type transistor Q11 and node N4, the gate of P-type transistor Q12 is coupled to node N2 of two-phase charge pump circuit PA in the previous stage. P-type transistor Q9 is coupled between output terminal O1 of two-phase charge pump circuit PA and the source of P-type transistor Q10, the gate of P-type transistor Q9 is coupled to node N4, the body of P-type transistor Q9 is coupled to the drain of the same and is coupled to the body of P-type transistor Q11, the drain of P-type transistor Q10 is coupled to node N4, the body of P-type transistor Q10 is coupled to the source of the same and is coupled to the body of P-type transistor Q11, the gate of P-type transistor Q10 is coupled to node N3. P-type transistor Q16 is coupled between node N4 and the body of P-type transistor Q15, the gate of P-type transistor Q16 is coupled to node N3, the body and the drain of P-type transistor Q16 are coupled to each other. P-type transistor Q15 is coupled between node N4 and output terminal O3 of four-phase charge pump circuit PB, and the gate of P-type transistor Q15 is coupled to node N3.

In addition, driving circuit 102 may include, for example, ring oscillator circuit 104 and logic circuit 106, ring oscillator circuit 104 is coupled to logic circuit 106. In which, ring oscillator circuit 104 includes delay circuit 108, delay circuit 110, delay circuit 112, NAND gate 114 and latch circuit 116. Delay circuits 108, 110 and 112 are connected in series as a delay circuit chain, the output terminal of the delay circuit chain is coupled to the input terminal of the delay circuit chain, the input terminal of NAND gate 114 receives input clock enable signal ENOSC and is coupled to an output terminal Q of the latch circuit 116, the output terminal of NAND gate 114 is coupled to the input terminal of the delay circuit chain. Besides, input terminal D of latch circuit 116 is coupled to the output terminal of the delay circuit chain, and control terminal ZEN of latch circuit 116 receives control signal SC1. Delay circuits 108, 110 and 112 may be implemented by inverters, for example. In the present embodiment, delay circuit 108 may include inverters D1 and D2 connected in series, delay circuits 110 and 112 may be implemented by inverters D3 and D4 respectively, but which is not limited herein. Each delay circuit may include different number of inverters according to the design requirements, and each inverter may have different delay times.

Ring oscillator circuit 104 is enabled and starts to generate the clock signal when input clock enable signal ENOSC is inputted into NAND gate 114, latch circuit 116 may determine whether to output the signal from the output terminal of the delay circuit chain to NAND gate 114 according to control signal SC1 received from control terminal ZEN. That is, latch circuit 116 may immediately make ring oscillator circuit 104 start or stop outputting the clock signal according to control signal SC1, so as to control the operations of two-phase charge pump circuit PA and four-phase charge pump circuit PB more precisely. It should be noted that ring oscillator circuit 104 may not include latch circuit 116 in some embodiments, which means that the output terminal of the delay circuit chain may directly connect to the input terminal of NAND gate 114.

Figure 3:
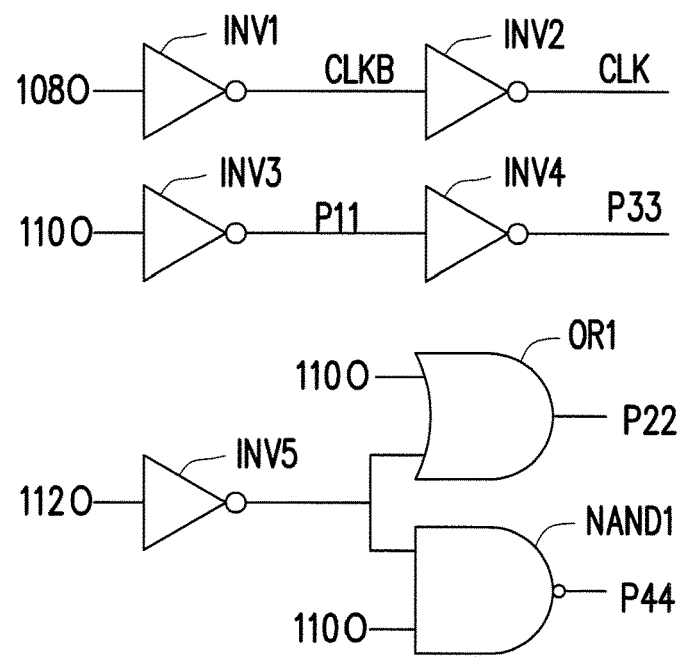
FIG. 3 is a schematic diagram of a logic circuit according to the embodiment of FIG. 1.

Logic circuit 106 generates the two-phase clock signal for driving two-phase charge pump circuit PA and the four-phase clock signals for driving four-phase charge pump circuit PB (clock signals P11, P22, P33 and P44 shown in FIG. 2) according to the delay signals of coupling the nodes between delay circuits 108, 110 and 112. For example, logic circuit 106 may generate clock signals CLK and CLB according to the output signal of delay circuit 108, where clock signals CLK and CLKB are inverse to each other, and generate clock signals P11, P22, P33 and P44 according to the output signal of delay circuits 110 and 112. Furthermore, logic circuit 106 may be implemented by the logical gates shown in FIG. 3, and the waveforms of the clock signals generated by logic circuit 106 of FIG. 3 may be shown in FIG. 4. Logic circuit 106 includes inverters INV1 to INV5, OR gate OR1 and NAND gate NAND1. The input terminal of inverter INV1 is coupled to the output terminal 108O of delay circuit 108, the input terminal of inverter INV2 is coupled to the output terminal of inverter INV1, where the output terminals of inverters INV1 and INV2 are respectively configured to output clock signals CLKB and CLK. The input terminal of inverter INV3 is coupled to the output terminal 110O of delay circuit 110, the input terminal of inverter INV4 is coupled to the output terminal of inverter INV3, where the output terminals of inverters INV3 and INV4 are respectively configured to output clock signals P11 and P33. The input terminal of inverter INV5 is coupled to the output terminal 112O of delay circuit 112, the input terminal of OR gate OR1 is coupled to the output terminal of inverter INV5 and the output terminal 110O of delay circuit 110, the input terminal of NAND gate NAND1 is coupled to the output terminal of inverter INV5 and the output terminal 110O of delay circuit 110, where OR gate OR1 is configured to output clock signal P22, and NAND gate NAND1 is configured to output clock signal P44.

Figure 4:
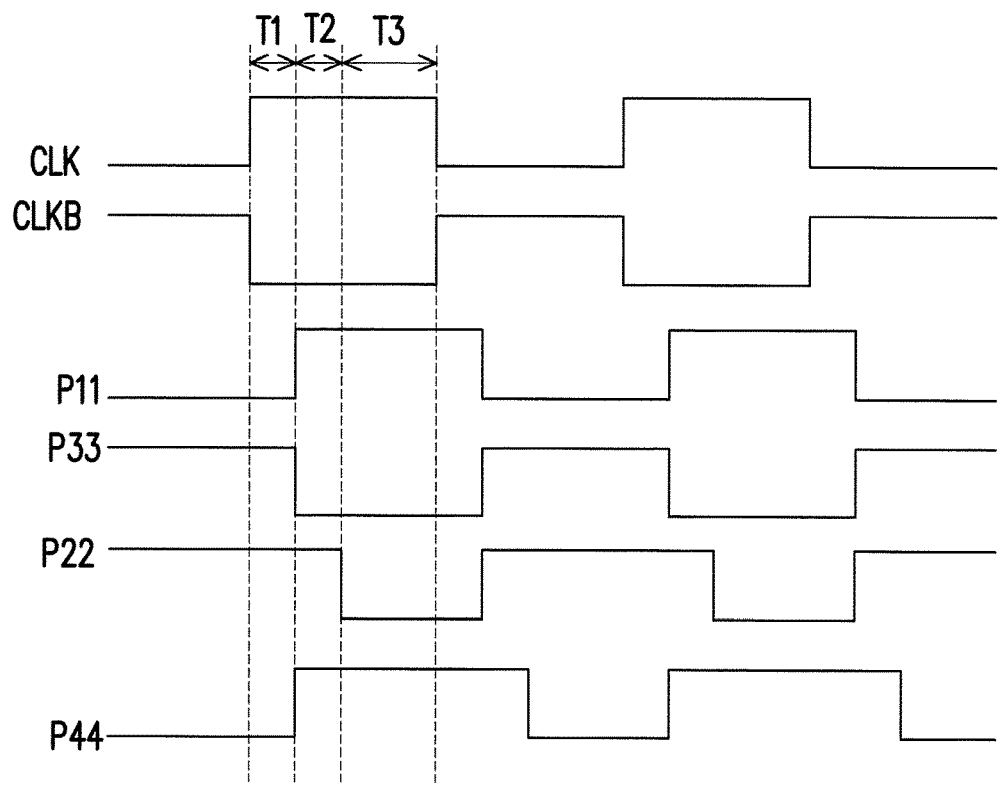
FIG. 4 is a waveform schematic diagram of clock signals according to the embodiment of FIG. 3.

As shown in FIG. 4, clock signals P11 and P33 are inverse to each other, and clock signals P11, P33 and P44 phase lag behind clock signals CLK and CLKB for a period of time T1 (i.e., the time delayed by inverter D3). Clock signal P22 lags behind clock signals CLK and CLKB for a time of T1 plus T2 (i.e., the time delayed by inverters D3 and D4), and time T3 is the time delayed by inverters D1 and D2.

The clock signals for driving two-phase charge pump circuit PA and four-phase charge pump circuit PB are generated by using the delay circuits of the ring oscillator existing in the general charge pump apparatus, hence the additional delay circuit for generating the clock signals for driving two-phase charge pump circuit PA and four-phase charge pump circuit PB is not needed anymore. In addition, the charge pump apparatus of the present embodiment combines the advantages of two-phase charge pump circuit PA and four-phase charge pump circuit PB by serial connecting two-phase charge pump circuit PA and four-phase charge pump circuit PB, so the charge pump apparatus has the characteristics of high efficiency, small area and low power consumption, and being without the problem of body effect, therefore the voltage needed can be generated accurately.

Figure 5:
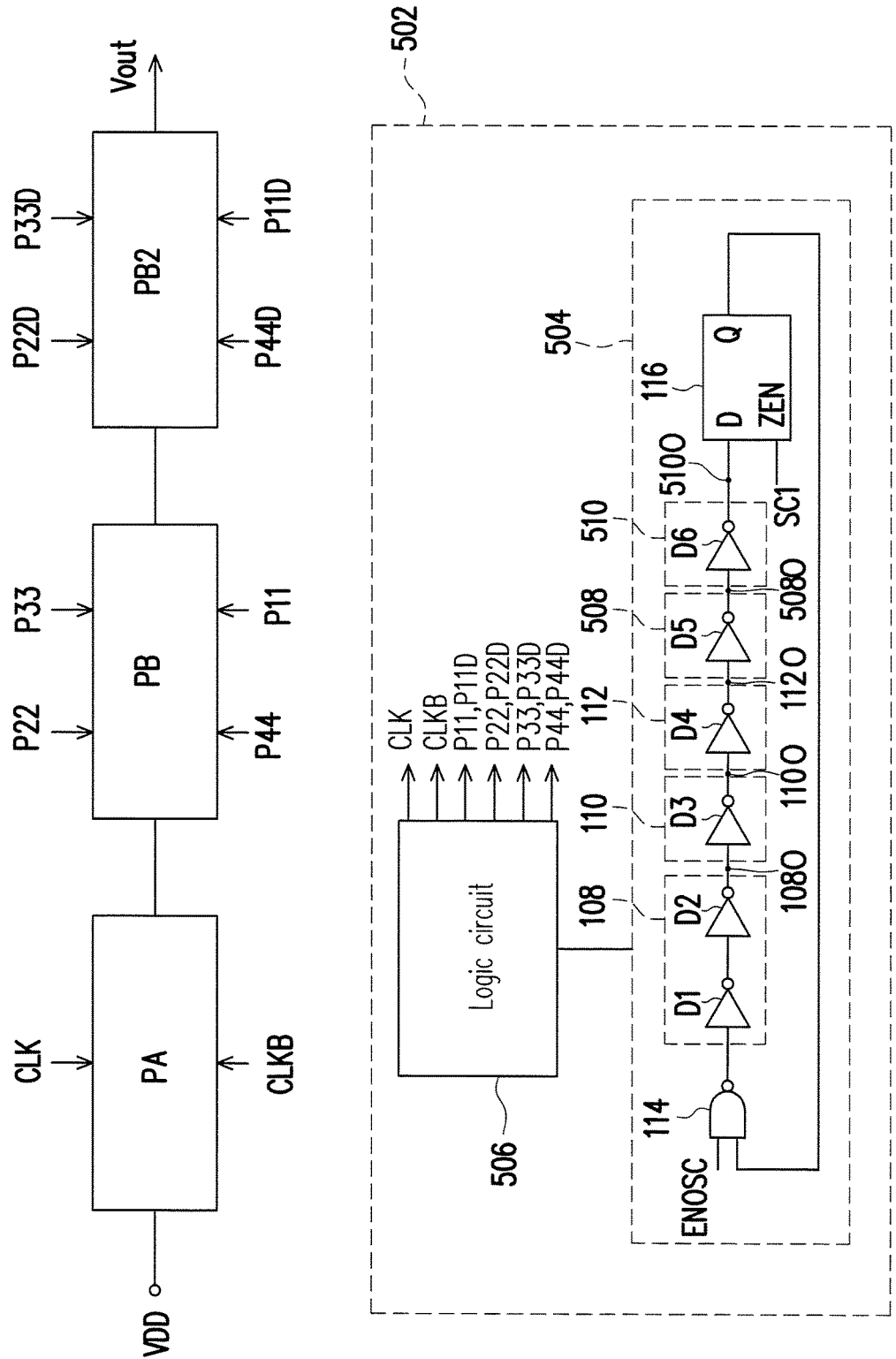
FIG. 5 is a schematic diagram of a charge pump apparatus according to another embodiment of the present invention.

FIG. 5 is a schematic view of a charge pump apparatus according to another embodiment of the present invention. Please refer to FIG. 5. Comparing to the charge pump apparatus in the embodiment of FIG. 1, the charge pump apparatus of the present embodiment further includes four-phase charge pump circuit PB2, which is coupled to the output terminal of four-phase charge pump circuit PB, and driven by clock signals P11D, P22D, P33D and P44D received from driving circuit 502. Four-phase charge pump circuit PB2 can be implemented as four-phase charge pump circuit PB in the embodiment of FIG. 2, therefore which is not repeated herein. It should be noted that the gates of P-type transistors Q5 and Q12 in four-phase charge pump circuit PB are respectively coupled to nodes N1 and N2 of two-phase charge pump circuit PA in the previous stage (i.e., coupled to the first terminals of capacitors C1 and C2 which receive clock signal CLK and CLKB). Similarly, in four-phase charge pump circuit PB2 implemented as four-phase charge pump circuit PB, the gates of the P-type transistors corresponding to P-type transistors Q5 and Q12 are coupled to nodes N3 and N4 of four-phase charge pump circuit PB (i.e., the four-phase charge pump circuit in the previous stage) as well, i.e., coupled to the first terminals of capacitors C5 and C6 which receive clock signal P33 and P11.

In addition, comparing to ring oscillator circuit 104 of FIG. 1, ring oscillator circuit 504 of the present embodiment further includes delay circuits 508 and 510. That is, the delay circuit chain of the present embodiment is constituted by serial connected delay circuits 108, 110, 112, 508 and 510. In the present embodiment, delay circuits 508 and 510 are implemented by inverter D5 and D6 respectively, but which is not limited thereto. In addition, logic circuit 506 of the present embodiment also generates the two-phase clock signal for driving two-phase charge pump circuit PA, the four-phase clock signals for driving four-phase charge pump circuit PB (i.e., clock signals P11, P22, P33 and P44) and the four-phase clock signals for driving four-phase charge pump circuit PB2 (i.e., clock signals P11D, P22D, P33D and P44D) according to the delay signals of coupling the nodes between delay circuits 108, 110, 112, 508 and 510.

Figure 6:
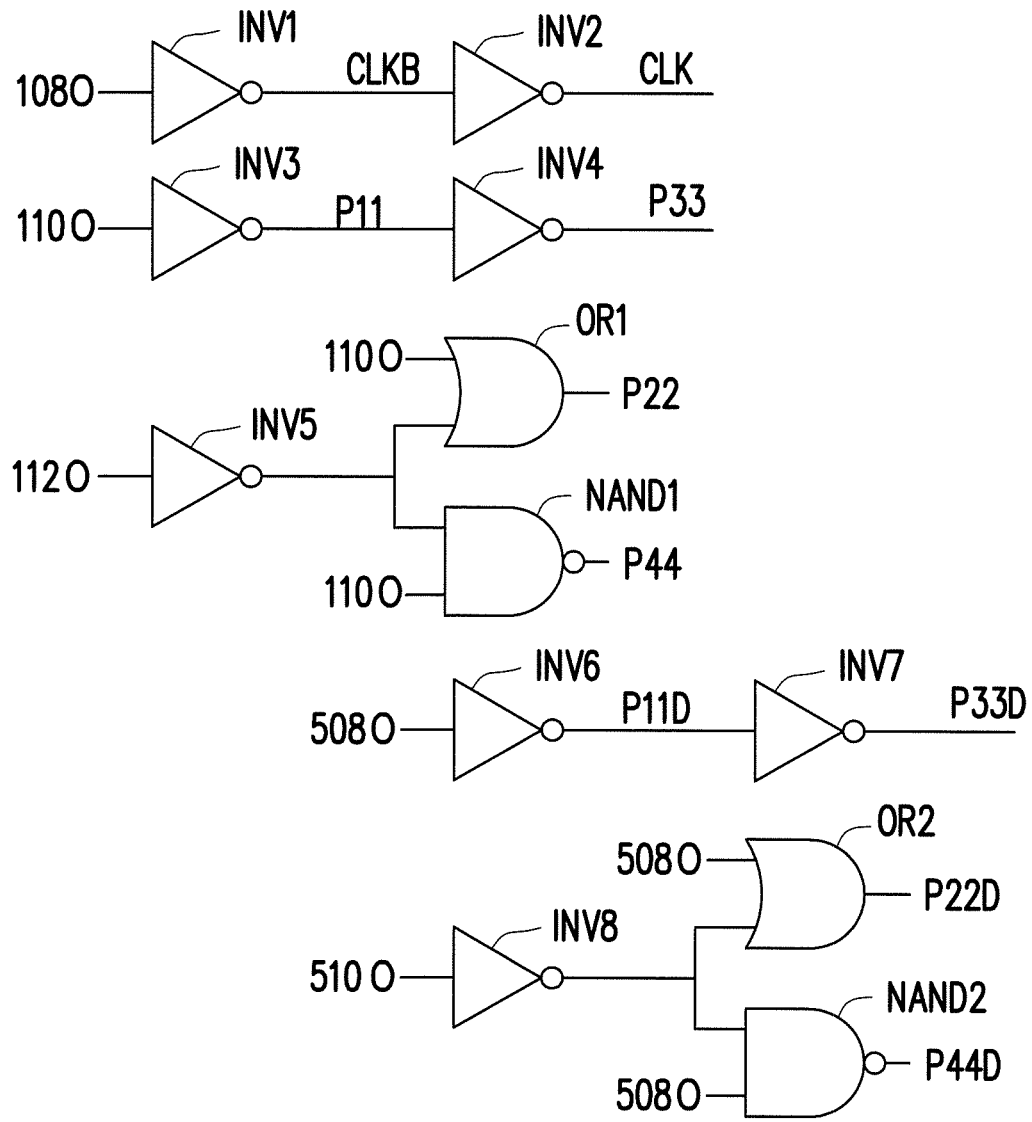
FIG. 6 is a schematic diagram of a logic circuit according to the embodiment of FIG. 5.
Figure 7:
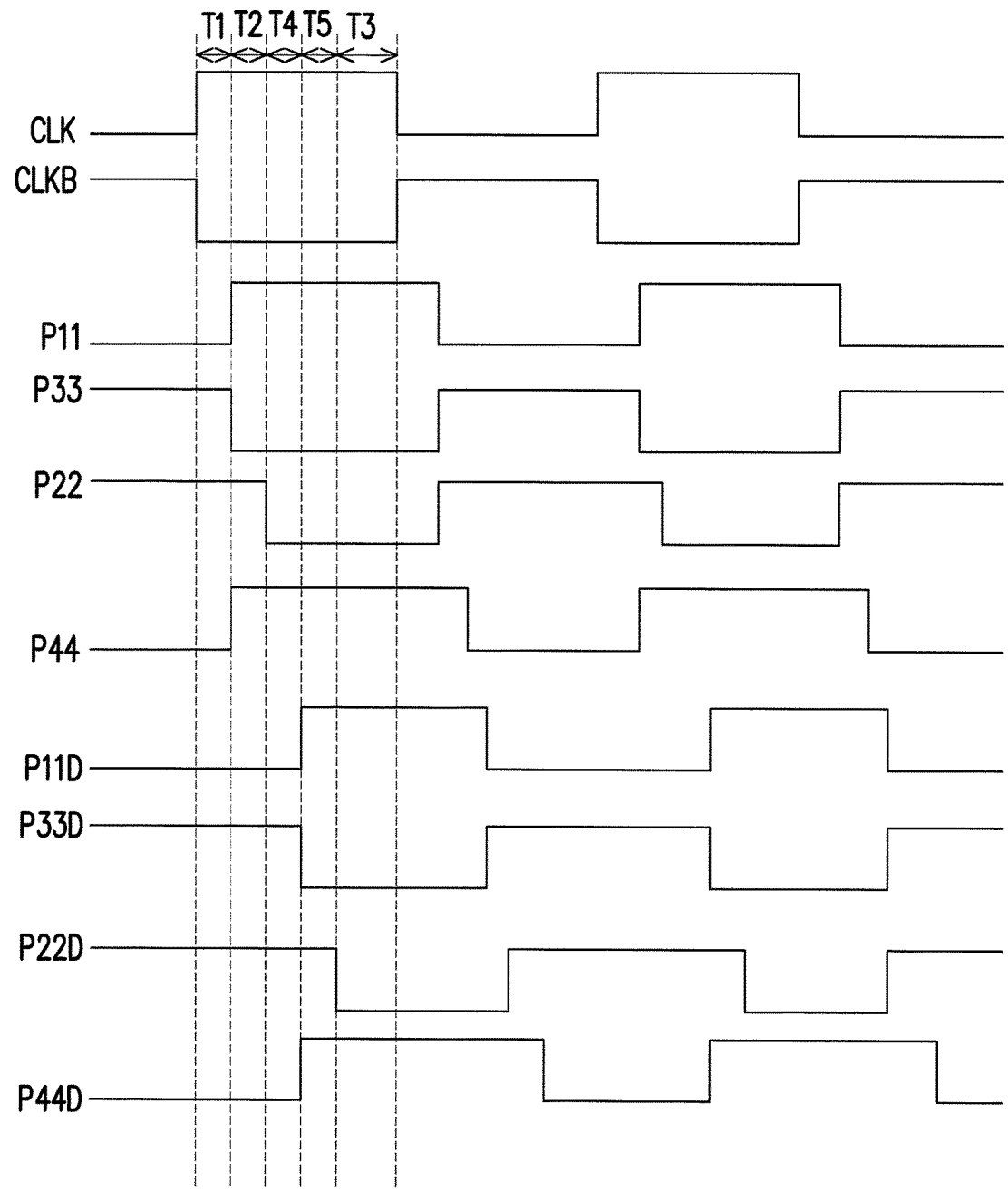
FIG. 7 is a waveform schematic diagram of clock signals according to the embodiment of FIG. 6.

Furthermore, logic circuit 506 may be implemented by the logical gates shown in FIG. 6, and the waveforms of the clock signals generated by logic circuit 506 of FIG. 6 may be shown in FIG. 7. Comparing to logic circuit 106 of FIG. 3, logic circuit 506 of the present embodiment further includes inverters INV6 to INV8, OR gate OR2 and NAND gate NAND2 for generating clock signals P11D to P44D. The input terminal of inverter INV6 is coupled to the output terminal 508O of delay circuit 508, the input terminal of inverter INV7 is coupled to the output terminal of inverter INV6, where the output terminals of inverters INV6 and INV7 are respectively configured to output clock signals P11D and P33D. The input terminal of inverter INV8 is coupled to the output terminal 510O delay circuit 510, the input terminal of OR gate OR2 is coupled to the output terminal of inverter INV8 and the output terminal 508O of delay circuit 508, the input terminal of NAND gate NAND2 is coupled to the output terminal of inverter INV8 and the output terminal 508O of delay circuit 508, where OR gate OR2 is configured to output clock signal P22D, and NAND gate NAND2 is configured to output clock signal P44D.

Similarly, as shown in FIG. 7, clock signals P11D and P33D are inverse to each other, and clock signals P11D, P33D and P44D phase lag behind clock signals CLK and CLKB for a summation of time T1, T2 and T4 (i.e., the time delayed by inverters D3, D4 and D5). Besides, clock signal P22D lags behind clock signals CLK and CLKB for a summation of time T1, T2, T4 and T5 (i.e., the time delayed by inverters D3, D4, D5 and D6). In addition, the relationships between clock signals P11 to P44 and clock signals CLK, CLKB are the same as the embodiment of FIG. 4, therefore which is not repeated herein.

It is noted that, it can be deduced from the aforementioned embodiments that the number of the four-phase charge pump circuit serial connected after two-phase charge pump circuit PA is not limited to one or two. In other embodiments, more four-phase charge pump circuits may be serial connected two-phase charge pump circuit PA, each of the serial connected four-phase charge pump circuits may be implemented as FIG. 2, and the coupling relationships between the serial connected four-phase charge pump circuits may be deduced from the embodiment of FIG. 5, which is not repeated herein. In addition, the way of generating the clock signals for driving each stage of the charge pump circuits may be known from the embodiments of FIG. 5 to FIG. 7, therefore which is not repeated herein.

Figure 8:
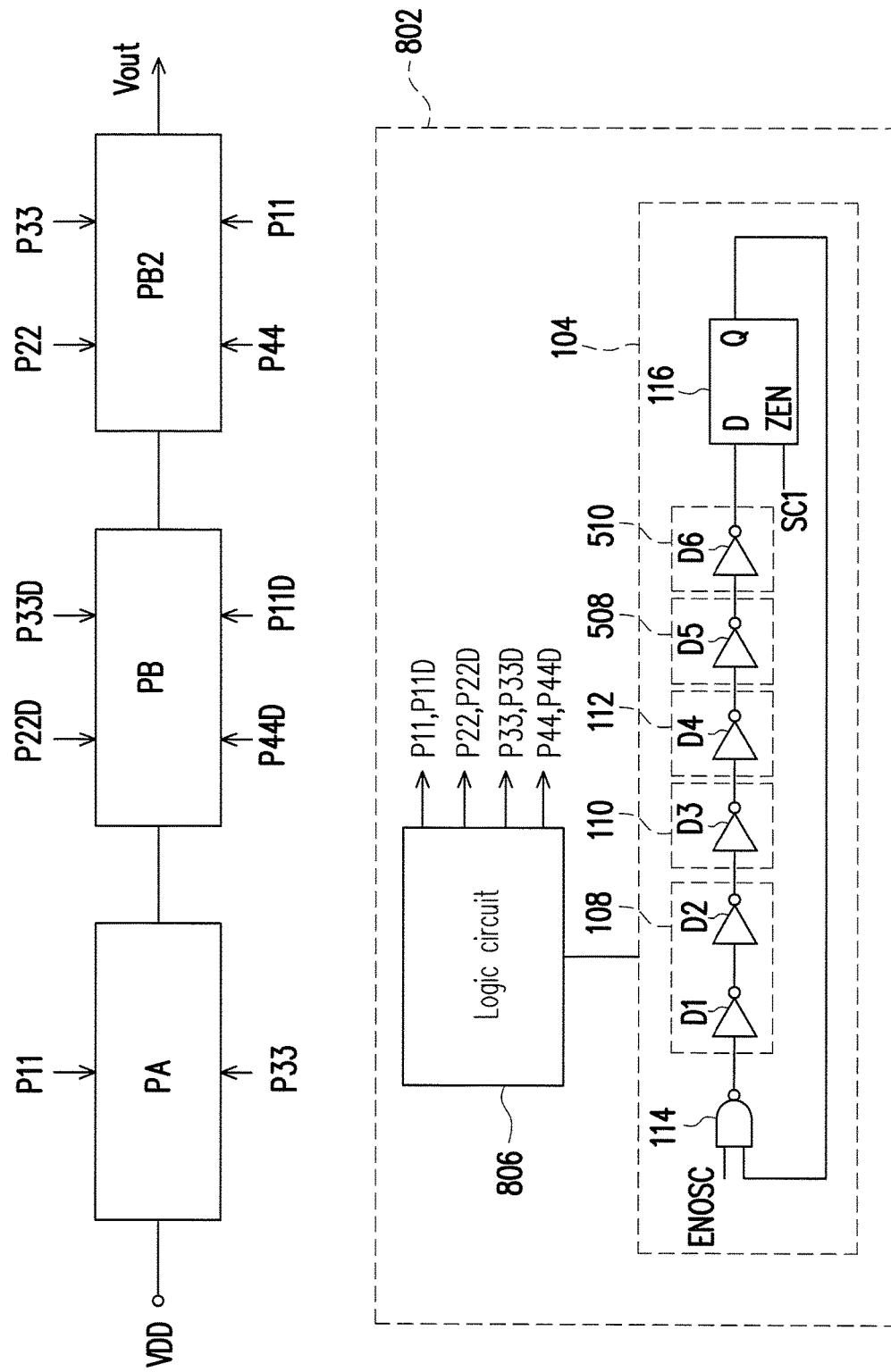
FIG. 8 is a schematic diagram of a charge pump apparatus according to another embodiment of the present invention.

Moreover, in some embodiments, clock signals P11 and P33 in the embodiment of FIG. 6 may be used to drive two-phase charge pump circuit PA, clock signals P11D to P44D in the embodiment of FIG. 6 may be used to drive odd-numbered four-phase charge pump circuits within the serial connected four-phase charge pump circuits, and clock signals P11 to P44 in the embodiment of FIG. 6 may be used to drive even-numbered four-phase charge pump circuits within the serial connected four-phase charge pump circuits. For example, FIG. 8 is a schematic view of a charge pump apparatus according to another embodiment of the present invention. Please refer to FIG. 8. Comparing to the charge pump apparatus in the embodiment of FIG. 5, Two-phase charge pump circuit PA of the present embodiment is driven by clock signals P11 and P33, four-phase charge pump circuit PB is driven by clock signals P11D to P44D, and four-phase charge pump circuit PB2 is driven by clock signals P11 to P44. In addition, logic circuit 806 of driving circuit 802 of the present embodiment may be implemented as logic circuit 506 of the embodiment of FIG. 5 (as shown in FIG. 6). Since the charge pump apparatus of the embodiment of FIG. 8 does not need clock signals CLK and CLKB to drive two-phase charge pump circuit PA, in some embodiments, logic circuit 806 does not include inverters INV1 and INV2, and delay circuits 108 and 110 of the present embodiment may be integrated into one delay circuit. The number of inverters in this delay circuit may be adjusted according to the real situations, which is not limited to the embodiment of FIG. 8. In addition, other circuits of driving circuit 802 are similar to the embodiment of FIG. 5, therefore which is not repeated herein.

Figure 9:
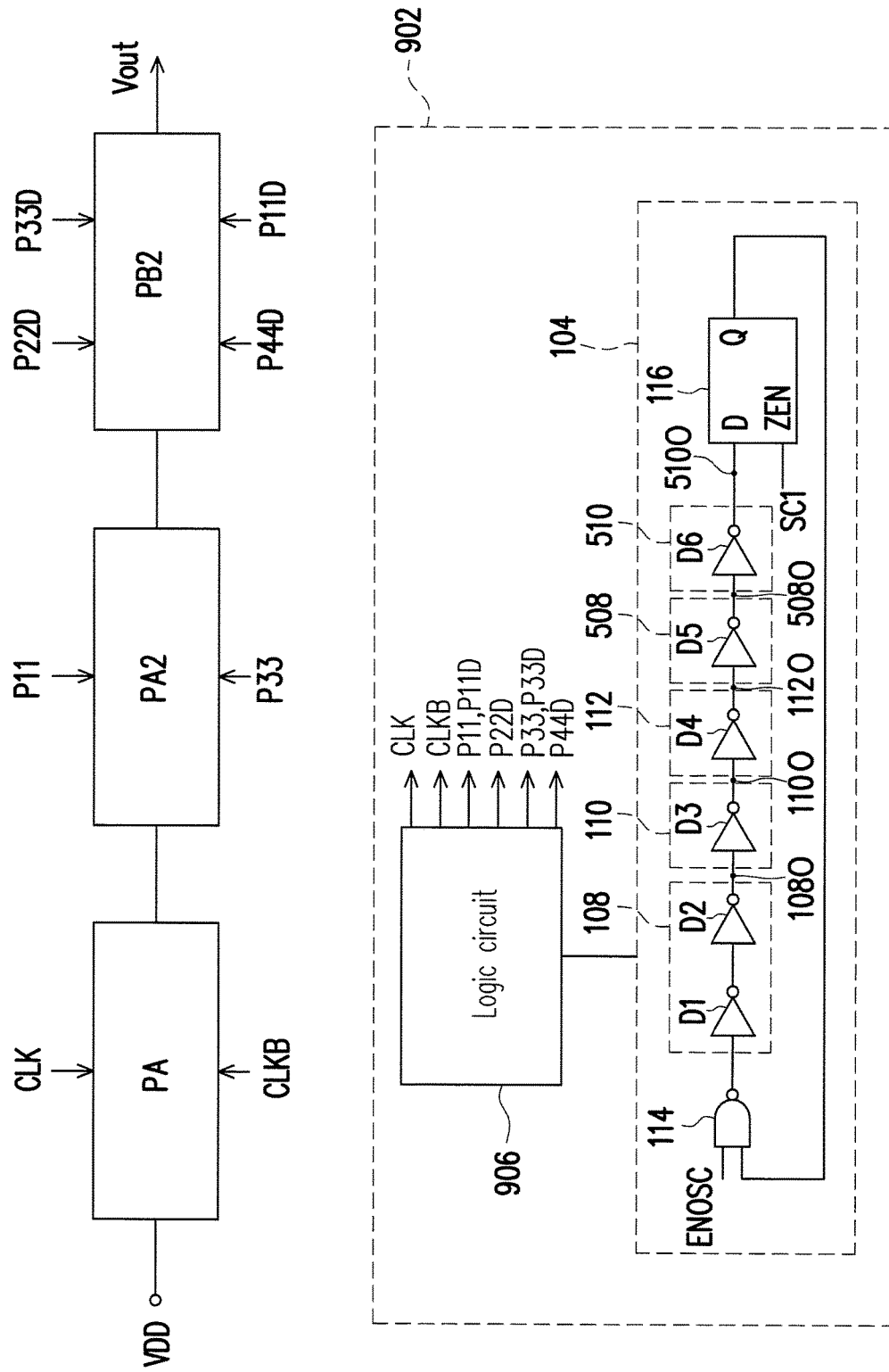
FIG. 9 is a schematic diagram of a charge pump apparatus according to another embodiment of the present invention.

FIG. 9 is a schematic view of a charge pump apparatus according to another embodiment of the present invention. Please refer to FIG. 9. Comparing to the charge pump apparatus in the embodiment of FIG. 5, Four-phase charge pump circuit PB of FIG. 5 is substituted by two-phase charge pump circuit PA2 in the present embodiment, so the charge pump apparatus of the present embodiment includes two-phase charge pump circuits PA, PA2 and four-phase charge pump circuit PB2, the input terminal of two-phase charge pump circuit PA2 is coupled to the output terminal of two-phase charge pump circuit PA, and the output terminal of two-phase charge pump circuit PA2 is coupled to the input terminal of four-phase charge pump circuit PB2. In which, two-phase charge pump circuit PA2 can be implemented as two-phase charge pump circuit PA in the embodiment of FIG. 2, therefore which is not repeated herein. Besides, the coupling relationship between two-phase charge pump circuit PA2 and four-phase charge pump circuit PB2 is also similar to which in FIG. 2, which is not repeated herein.

Figure 10:
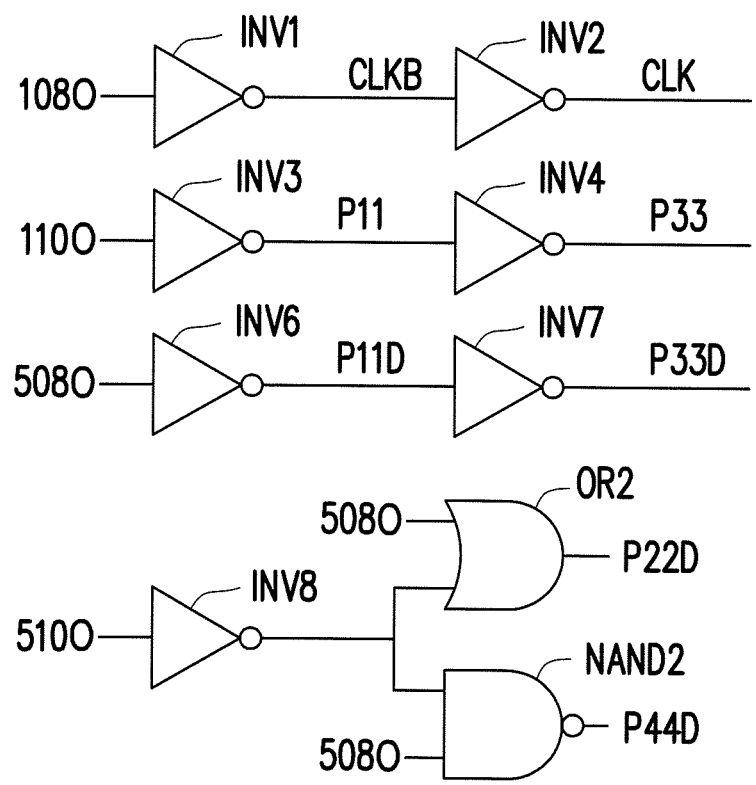
FIG. 10 is a schematic diagram of a logic circuit according to the embodiment of FIG. 9.

In the embodiment of FIG. 9, two-phase charge pump circuit PA and four-phase charge pump circuit PB2 may be driven by clock signals CLK, CLKB and P11D to P44D of the embodiment of FIG. 7, and two-phase charge pump circuit PA2 is driven by clock signals P11 and P33. Logic circuit 906 of driving circuit 902 of the present embodiment may be implemented as the logic circuit of the embodiment of FIG. 6. Since clock signals P22 and P44 are not needed to drive the charge pump apparatus in the present embodiment, in some embodiments, logic circuit 906 does not include inverter INV5, OR gate OR1 and NAND gate NAND1. Other gate circuits and output signals are the same as the embodiment of FIG. 6 (as shown in FIG. 10). In addition, other circuits of driving circuit 902 are similar to the embodiment of FIG. 5, therefore which is not repeated herein.

In summary, the embodiments of the present invention use the delay circuits of the ring oscillator existing in the general charge pump apparatus to generate the clock signals for driving the two-phase charge pump circuit and the four-phase charge pump circuit, hence the additional delay circuit for generating the clock signals for driving the two-phase charge pump circuit and the four-phase charge pump circuit is not needed anymore, and the area of the circuit layout is thus reduced substantially. In addition, the advantages of the two-phase charge pump circuit and the four-phase charge pump circuit are combined by serial connecting the two-phase charge pump circuit and the four-phase charge pump circuit, so the charge pump apparatus has the characteristics of high efficiency, small area and low power consumption, and being without the problem of body effect, therefore the voltage needed can be generated accurately.

It should further be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the invention. Further combinations of the above features are also considered to be within the scope of some embodiments of the invention. It will also be appreciated by persons skilled in the art that the present invention is not limited to what has been particularly shown and described hereinabove.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:
1. A charge pump apparatus, comprising:
 a first two-phase charge pump circuit and a first four-phase charge pump circuit coupled in series, wherein the first four-phase charge pump circuit coupled to an output terminal of the first two-phase charge pump circuit; and
 a driving circuit, coupled to the first two-phase charge pump circuit and the first four-phase charge pump circuit, the driving circuit comprising:
  a ring oscillator circuit, comprising:
   a plurality of delay circuits connected in series as a delay circuit chain, wherein an output terminal of the delay circuit chain is coupled to an input terminal of the delay circuit chain, and the input terminal of the delay circuit chain receives an input clock signal; and
  a logic circuit, coupled to the ring oscillator circuit, the first two-phase charge pump circuit and the first four-phase charge pump circuit, wherein the logic circuit generates a first two-phase clock signal for driving the first two-phase charge pump circuit and a first four-phase clock signal for driving the first four-phase charge pump circuit according to a plurality of delay signals of coupling a plurality of nodes between the delay circuits; and a second four-phase charge pump circuit, coupled to an output terminal of the first four-phase charge pump circuit to serial connect to the first two-phase charge pump circuit and the first four-phase charge pump circuit, wherein the delay circuit chain comprises a first delay circuit, a second delay circuit and a third delay circuit connected in series, the first delay circuit delays the input clock signal, the second delay circuit delays an output signal of the first delay circuit, the third delay circuit delays an output signal of the second delay circuit, and the logic circuit generates the first two-phase clock signal according to the output signal of the first delay circuit, wherein the first two-phase clock signal comprises a first clock signal and a second clock signal being inverse to each other, wherein the logic circuit further generates the first four-phase clock signal according to the output signal of the second delay circuit and an output signal of the third delay circuit, wherein the first four-phase clock signal comprises a third clock signal, a fourth clock signal, a fifth clock signal and a sixth clock signal, wherein the logic circuit further generates a second four-phase clock signal for driving the second four-phase charge pump circuit according to the delay signals of coupling the nodes between the delay circuits, wherein the delay circuit chain further comprises a fourth delay circuit and a fifth delay circuit serial connected to the third delay circuit, the fourth delay circuit delays the output signal of the third delay circuit, the fifth delay circuit delays an output signal of the fourth delay circuit, the logic circuit further generates the second four-phase clock signal according to the output signal of the fourth delay circuit and an output signal of the fifth delay circuit, wherein the second four-phase clock signal comprises a seventh clock signal, an eighth clock signal, a ninth clock signal and a tenth clock signal.

2. The charge pump apparatus as claimed in claim 1, wherein the logic circuit comprises:
a first inverter, wherein an input terminal of the first inverter is coupled to an output terminal of the first delay circuit, and the first inverter outputs the first clock signal;
a second inverter, wherein an input terminal of the second inverter is coupled to an output terminal of the first inverter, and the second inverter outputs the second clock signal;
a third inverter, wherein an input terminal of the third inverter is coupled to an output terminal of the second delay circuit, and the third inverter outputs the third clock signal;
a fourth inverter, wherein an input terminal of the fourth inverter is coupled to an output terminal of the third inverter, and the fourth inverter outputs the fourth clock signal;
a fifth inverter, wherein an input terminal of the fifth inverter is coupled to an output terminal of the third delay circuit;
a first OR gate, wherein two input terminals of the first OR gate respectively coupled to an output terminal of the fifth inverter and the output terminal of the second delay circuit, and the first OR gate outputs the fifth clock signal; and
a first NAND gate, wherein two input terminals of the first NAND gate respectively coupled to the output terminal of the fifth inverter and the output terminal of the second delay circuit, and the first NAND gate outputs the sixth clock signal.

3. The charge pump apparatus as claimed in claim 1, wherein the logic circuit further comprises:
a sixth inverter, wherein an input terminal of the sixth inverter is coupled to an output terminal of the fourth delay circuit, and the sixth inverter outputs the seventh clock signal;
a seventh inverter, wherein an input terminal of the seventh inverter is coupled to an output terminal of the sixth inverter, and the seventh inverter outputs the eighth clock signal;
an eighth inverter, wherein an input terminal of the eighth inverter is coupled to an output terminal of the fifth delay circuit;
a second OR gate, wherein two input terminals of the second OR gate respectively coupled to an output terminal of the eighth inverter and the output terminal of the fourth delay circuit, and the second OR gate outputs the ninth clock signal; and
a second NAND gate, wherein two input terminals of the second NAND gate respectively coupled to the output terminal of the eighth inverter and the output terminal of the fifth delay circuit, and the second NAND gate outputs the tenth clock signal.

4. A charge pump apparatus, comprising
a first two-phase charge pump circuit and a first four-phase charge pump circuit coupled in series, wherein the first four-phase charge pump circuit coupled to an output terminal of the first two-phase charge pump circuit; and
a driving circuit, coupled to the first two-phase charge pump circuit and the first four-phase charge pump circuit, the driving circuit comprising:
a ring oscillator circuit, comprising:
a plurality of delay circuits connected in series as a delay circuit chain, wherein an output terminal of the delay circuit chain is coupled to an input terminal of the delay circuit chain, and the input terminal of the delay circuit chain receives an input clock signal; and
a logic circuit, coupled to the ring oscillator circuit, the first two-phase charge pump circuit and the first four-phase charge pump circuit, wherein the logic circuit generates a first two-phase clock signal for driving the first two-phase charge pump circuit and a first four-phase clock signal for driving the first four-phase charge pump circuit according to a plurality of delay signals of coupling a plurality of nodes between the delay circuits; and
a second two-phase charge pump circuit, coupled between the output terminal of the first two-phase charge pump circuit and the first four-phase charge pump circuit, wherein the logic circuit further generates a second two-phase clock signal for driving the second two-phase charge pump circuit according to the delay signals of coupling the nodes between the delay circuits, wherein the delay circuit chain comprises a first delay circuit, a second delay circuit and a third delay circuit connected in series, the first delay circuit delays the input clock signal, the second delay circuit delays an output signal of the first delay circuit, the third delay circuit delays an output signal of the second delay circuit, and the logic circuit generates the first two-phase clock signal according to the output signal of the first delay circuit, wherein the first two-phase clock signal comprises a first clock signal and a second clock signal being inverse to each other, wherein the logic circuit further generates the second two-phase clock signal according to the output signal of the second delay circuit, and the second two-phase clock signal comprises a third clock signal and a fourth clock signal being inverse to each other.

5. The charge pump apparatus as claimed in claim 4, wherein the delay circuit chain further comprises a fourth delay circuit and a fifth delay circuit serial connected to the third delay circuit, the fourth delay circuit delays the output signal of the third delay circuit, the fifth delay circuit delays an output signal of the fourth delay circuit, the logic circuit further generates the first four-phase clock signal according to the output signal of the fourth delay circuit and an output signal of the fifth delay circuit, wherein the first four-phase clock signal comprises a fifth clock signal, a sixth clock signal, a seventh clock signal and an eighth clock signal.

6. The charge pump apparatus as claimed in claim 5, wherein the logic circuit comprises:
a first inverter, wherein an input terminal of the first inverter is coupled to an output terminal of the first delay circuit, and the first inverter outputs the first clock signal;
a second inverter, wherein an input terminal of the second inverter is coupled to an output terminal of the first inverter, and the second inverter outputs the second clock signal;
a third inverter, wherein an input terminal of the third inverter is coupled to an output terminal of the second delay circuit, and the third inverter outputs the third clock signal;
a fourth inverter, wherein an input terminal of the fourth inverter is coupled to an output terminal of the third inverter, and the fourth inverter outputs the fourth clock signal;
a fifth inverter, wherein an input terminal of the fifth inverter is coupled to an output terminal of the fourth delay circuit, and the sixth inverter outputs the fifth clock signal;
a sixth inverter, wherein an input terminal of the sixth inverter is coupled to an output terminal of the fifth inverter, and the sixth inverter outputs the sixth clock signal;
a seventh inverter, wherein an input terminal of the seventh inverter is coupled to an output terminal of the fifth delay circuit;
an OR gate, wherein two input terminals of the OR gate respectively coupled to an output terminal of the seventh inverter and the output terminal of the fourth delay circuit, and the OR gate outputs the seventh clock signal; and
a NAND gate, wherein two input terminals of the NAND gate respectively coupled to the output terminal of the seventh inverter and the output terminal of the fourth delay circuit, and the NAND gate outputs the eighth clock signal.

7. The charge pump apparatus as claimed in claim 1, wherein the ring oscillator circuit further comprises:
a NAND gate, wherein an input terminal of the NAND gate receives the input clock signal, another input terminal of the NAND gate is coupled to an output terminal of the delay circuit chain, and an output terminal of the NAND gate is coupled to an input terminal of the delay circuit chain.

8. The charge pump apparatus as claimed in claim 7, wherein the ring oscillator circuit further comprises:
a latch circuit, coupled between the output terminal of the delay circuit chain and the another input terminal of the NAND gate, determining whether to output a signal from the output terminal of the delay circuit chain to the NAND gate according to a control signal.

9. A charge pump apparatus, comprising:
a two-phase charge pump circuit and a plurality of four-phase charge pump circuits coupled in series, wherein the plurality of four-phase charge pump circuits coupled to an output terminal of the two-phase charge pump circuit; and
a driving circuit, coupled to the two-phase charge pump circuit and the four-phase charge pump circuits, the driving circuit comprising:
a ring oscillator circuit, comprising:
a plurality of delay circuits connected in series as a delay circuit chain, wherein an output terminal of the delay circuit chain is coupled to an input terminal of the delay circuit chain, the input terminal of the delay circuit chain receives an input clock signal; and
a logic circuit, coupled to the ring oscillator circuit, the two-phase charge pump circuit and the four-phase charge pump circuits, generating a two-phase clock signal for driving the two-phase charge pump circuit and a plurality of first four-phase clock signals and a plurality of second four-phase clock signals for driving the four-phase charge pump circuits according to a plurality of delay signals of coupling a plurality of nodes between the delay circuits, wherein the first four-phase clock signals are configured to drive corresponding odd-numbered four-phase charge pump circuits, and the second four-phase clock signals are configured to drive corresponding even-numbered four-phase charge pump circuits,
wherein the delay circuit chain comprises a first delay circuit, a second delay circuit, a third delay circuit and a fourth delay circuit connected in series, the first delay circuit delays the input clock signal, the second delay circuit delays an output signal of the first delay circuit, the third delay circuit delays an output signal of the second delay circuit, and the fourth delay circuit delays an output signal of the third delay circuit, the logic circuit further generates the two-phase clock signal according to the output signal of the first delay circuit, generates the first four-phase clock signal according to the output signals of the second delay circuit and the first delay circuit, and generates the second four-phase clock signal according to the output signals of the third delay circuit and the fourth delay circuit.

10. The charge pump apparatus as claimed in claim 9, wherein the two-phase clock signal comprises a first clock signal and a second clock signal being inverse to each other, the first four-phase clock signal comprises the first clock signal, the second clock signal, a third clock signal and a fourth clock signal, and the second four-phase clock signal comprises a fifth clock signal, a sixth clock signal, a seventh clock signal and an eighth clock signal, wherein the fifth clock signal and the sixth clock signal are inverse to each other.

11. The charge pump apparatus as claimed in claim 10, wherein the driving circuit comprises:

a first inverter, wherein an input terminal of the first inverter is coupled to an output terminal of the first delay circuit, and the first inverter outputs the first clock signal;

a second inverter, coupled to an output terminal of the first inverter, outputting the second clock signal;

a third inverter, wherein an input terminal of the third inverter is coupled to an output terminal of the second delay circuit;

a first OR gate, wherein two input terminals of the first OR gate respectively coupled to an output terminal of the third inverter and an output terminal of the first delay circuit, and the first OR gate outputs the third clock signal;

a first NAND gate, wherein two input terminals of the first NAND gate respectively coupled to the output terminal of the third inverter and the output terminal of the first delay circuit, and the first NAND gate outputs the fourth clock signal;

a fourth inverter, wherein an input terminal of the fourth inverter is coupled to an output terminal of the third delay circuit, and the fourth inverter outputs the fifth clock signal;

a fifth inverter, wherein an input terminal of the fifth inverter is coupled to an output terminal of the fourth inverter, and the fifth inverter outputs the sixth clock signal;

a sixth inverter, wherein an input terminal of the sixth inverter is coupled to an output terminal of the fourth delay circuit;

a second OR gate, wherein two input terminals of the second OR gate respectively coupled to an output terminal of the sixth inverter and the output terminal of the third delay circuit, and the second OR gate outputs the seventh clock signal; and a second NAND gate, wherein two input terminals of the second NAND gate respectively coupled to the output terminal of the sixth inverter and the output terminal of the third delay circuit, and the second NAND gate outputs the eighth clock signal.

12. The charge pump apparatus as claimed in claim 9, wherein the ring oscillator circuit further comprises:
a NAND gate, wherein an input terminal of the NAND gate receives a clock enable signal, another input terminal of the NAND gate is coupled to an output terminal of the delay circuit chain, and the NAND gate outputs the input clock signal.

13. The charge pump apparatus as claimed in claim 12, wherein the ring oscillator circuit further comprises:
a latch circuit, coupled between the output terminal of the delay circuit chain and the another input terminal of the NAND gate, determining whether to output a signal from the output terminal of the delay circuit chain to the NAND gate according to a control signal.

* * * * *